United States Patent
Roovers

(10) Patent No.: US 10,274,601 B2
(45) Date of Patent: Apr. 30, 2019

(54) COMMUNICATIONS SYSTEM

(71) Applicant: NXP B.V., Eindhoven (NL)

(72) Inventor: Raf Lodewijk Jan Roovers, Wommelgem (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/014,770

(22) Filed: Jun. 21, 2018

(65) Prior Publication Data

US 2019/0018145 A1   Jan. 17, 2019

(30) Foreign Application Priority Data

Jul. 17, 2017   (EP) ..................................... 17181692

(51) Int. Cl.
*H03L 7/00* (2006.01)
*H03L 7/06* (2006.01)
(Continued)

(52) U.S. Cl.
CPC ............ *G01S 19/03* (2013.01); *G01S 19/256* (2013.01); *H03L 7/00* (2013.01); *H03L 7/06* (2013.01);
(Continued)

(58) Field of Classification Search
CPC .. G01S 19/03; G01S 19/256; H04W 56/0015; H04W 84/20; G02B 15/167;
(Continued)

(56) References Cited

U.S. PATENT DOCUMENTS

| | | | |
|---|---|---|---|
| 6,542,754 B1 * | 4/2003 | Sayers | H04B 7/269 370/350 |
| 2003/0177154 A1 * | 9/2003 | Vrancic | G06F 1/12 708/160 |

(Continued)

OTHER PUBLICATIONS

Atmel Corporation "Application Note, AT03155 Real-Time-Clock Calibration and Compensation", version 42251, 18 pgs. (Mar. 2014).

(Continued)

*Primary Examiner* — Brandon J Miller
(74) *Attorney, Agent, or Firm* — Rajeev Madnawat

(57) ABSTRACT

A communications system comprising a master-node and a slave-node. The master-node comprising: a GNSS receiver configured to provide a GNSS based time reference signal; a master-timing-reference-calibrator configured to determine a master-timing-reference-calibration-signal, for calibrating the master reference timing circuit, based on the GNSS based time reference signal; and a master-reference-timing-circuit configured to provide a master-clock-signal based on the master-timing-reference-calibration-signal, wherein the master-clock-signal is a clock signal for the master-node; and a master-transmitter configured to determine a master-communications-signal using the master-clock signal. The slave-node comprising: a slave-receiver configured to receive the master-communications-signal from the master-node; a slave-timing-reference-calibrator configured to determine a slave-timing-reference-calibration-signal based on the master-communications-signal; and a slave-timing-reference-circuit configured to provide a slave-clock-signal based on the slave-timing-reference-calibration-signal, wherein the slave-clock-signal is a clock signal for the slave-node.

15 Claims, 3 Drawing Sheets

(51) Int. Cl.
*G01S 19/03* (2010.01)
*G01S 19/25* (2010.01)
*H04W 56/00* (2009.01)
*H04W 84/20* (2009.01)

(52) U.S. Cl.
CPC ....... *H04W 56/0015* (2013.01); *H04W 84/20* (2013.01)

(58) Field of Classification Search
CPC .. G02B 27/4211; G02B 13/002; G02B 13/02; H04L 7/00; H03L 7/06
See application file for complete search history.

(56) References Cited

U.S. PATENT DOCUMENTS

| | | | | |
|---|---|---|---|---|
| 2007/0194987 A1* | 8/2007 | Fedora | ................. | G01S 5/0226 342/386 |
| 2008/0316996 A1 | 12/2008 | Hatala | | |
| 2009/0034672 A1 | 2/2009 | Cho et al. | | |
| 2011/0199262 A1* | 8/2011 | Karaoguz | .............. | G01S 19/25 342/357.64 |
| 2011/0309976 A1* | 12/2011 | Leclercq | ................. | G01S 19/34 342/357.25 |
| 2013/0272362 A1* | 10/2013 | Mirek | ................... | H04J 3/0676 375/226 |
| 2015/0003479 A1* | 1/2015 | Shenoi | .................. | H04J 3/0661 370/503 |
| 2015/0055636 A1 | 2/2015 | Rausch et al. | | |
| 2015/0358930 A1 | 12/2015 | Navslekar et al. | | |
| 2016/0330707 A1* | 11/2016 | Das | ....................... | H04W 76/10 |
| 2016/0341557 A1* | 11/2016 | Kondo | ................... | G01C 21/28 |
| 2017/0215119 A1* | 7/2017 | Hong | ................... | H04W 36/08 |
| 2017/0223617 A1* | 8/2017 | Bitra | ..................... | H04W 48/16 |
| 2017/0261615 A1* | 9/2017 | Ying | ...................... | G01S 19/21 |

OTHER PUBLICATIONS

Lombardi, M. "The Use of GPS Disciplined Oscillators as Primary Frequency Standards for Calibration Laboratories, Technical Papers", Measure: The Journal of Measurement Science, vol. 3, issue 3, www.ncsli.org, pp. 58-65, (Sep. 1, 2008).

* cited by examiner

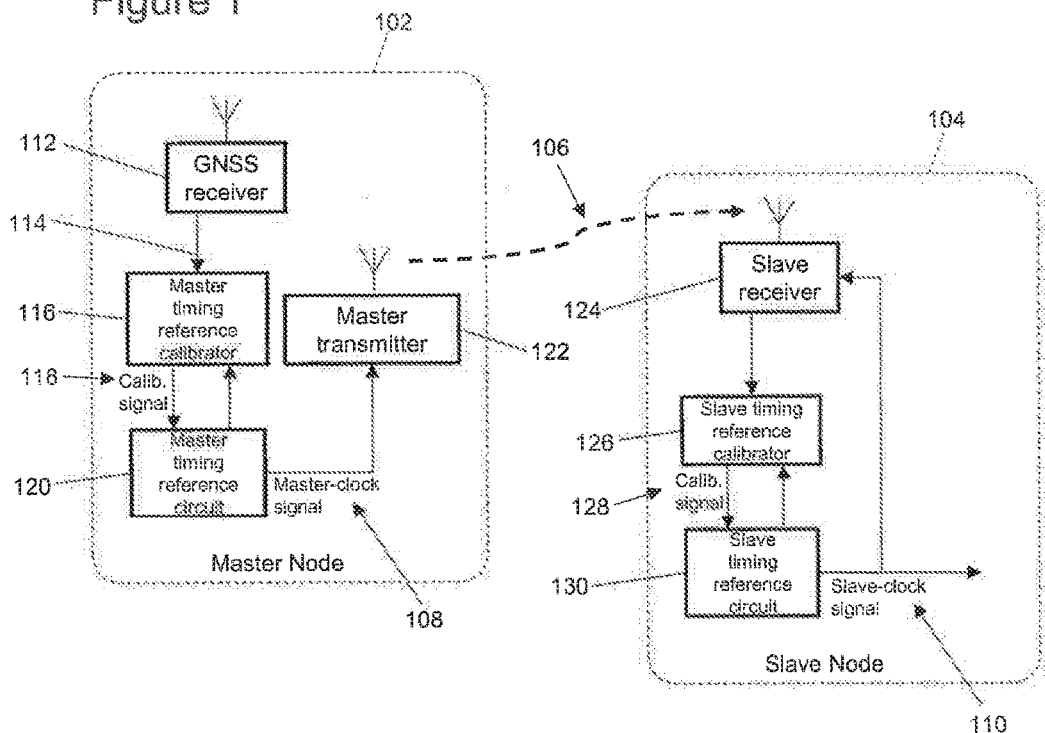
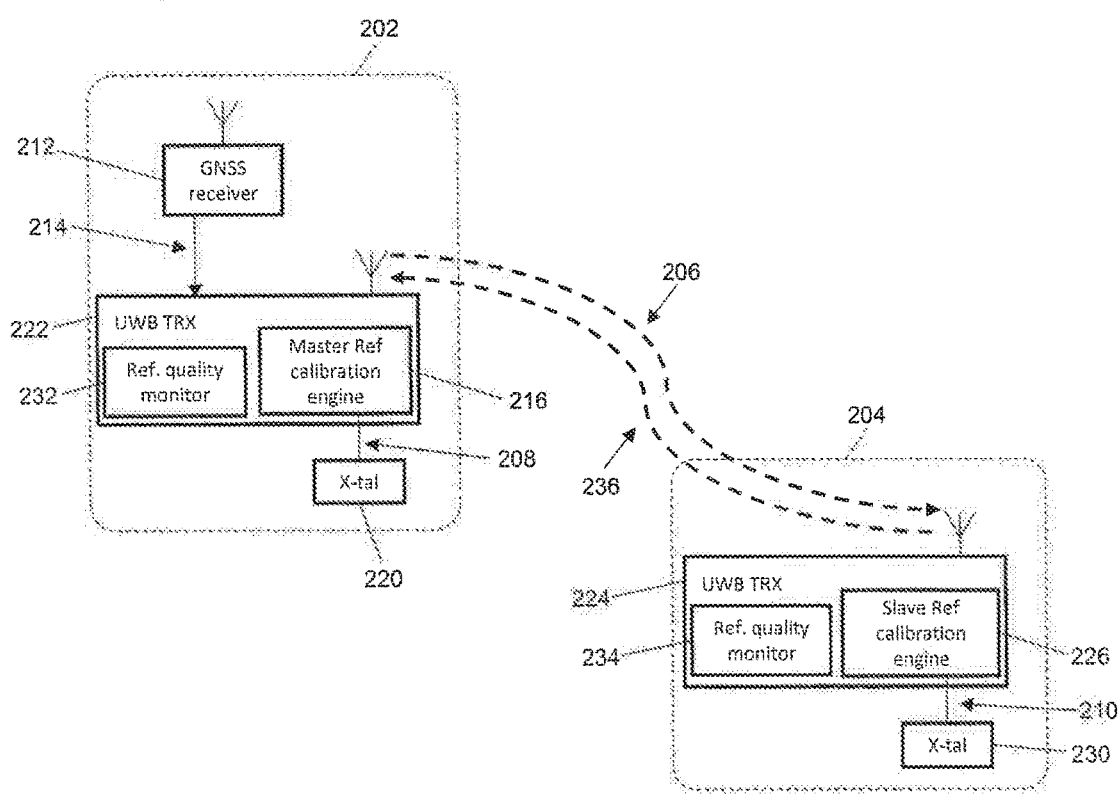

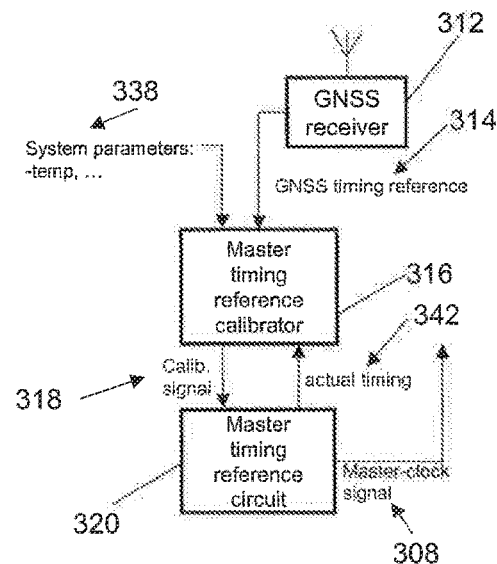
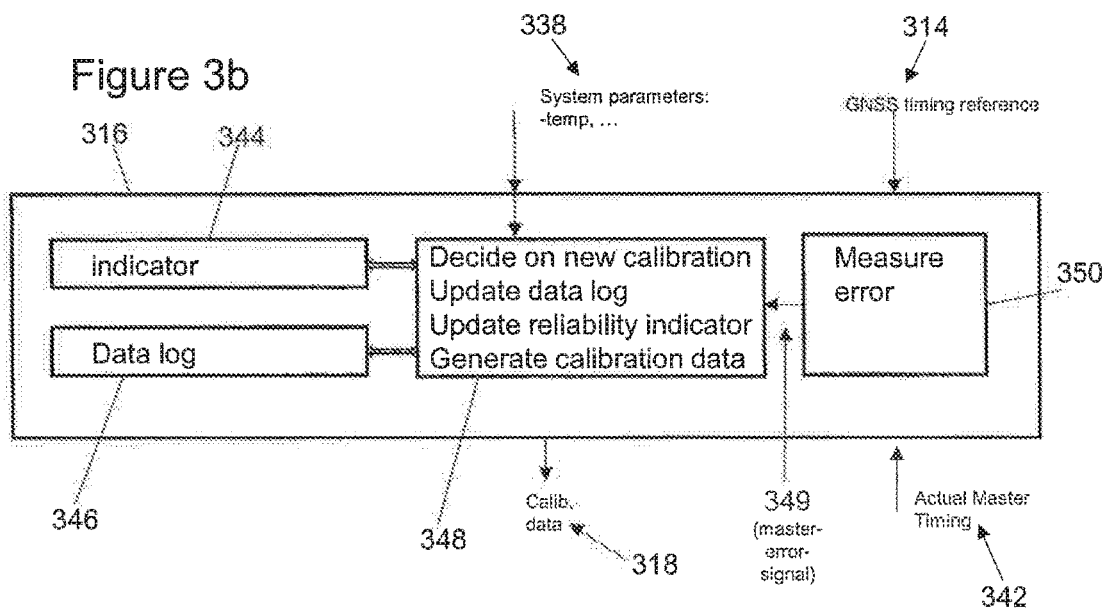

his application claims the priority under 35 U.S.C. § 119 of European Patent application no. 17181692.9, filed on Jul. 17, 2017, the contents of which are incorporated by reference herein.

The present disclosure relates to communications systems, and in particular to communications systems that include at least two nodes that have locally generated clock signals.

According to a first aspect of the present disclosure there is provided a communications system comprising:
a master-node comprising:
   a GNSS receiver configured to provide a GNSS based time reference signal;
   a master-timing-reference-calibrator configured to determine a master-timing-reference-calibration-signal, for calibrating the master reference timing circuit, based on the GNSS based time reference signal;
   a master-reference-timing-circuit configured to provide a master-clock-signal based on the master-timing-reference-calibration-signal, wherein the master-clock-signal is a clock signal for the master-node; and
   a master-transmitter configured to determine a master-communications-signal using the master-clock-signal;
a slave-node comprising:
   a slave-receiver configured to receive the master-communications-signal from the master-node;
   a slave-timing-reference-calibrator configured to determine a slave-timing-reference-calibration-signal based on the master-communications-signal; and
   a slave-timing-reference-circuit configured to provide a slave-clock-signal based on the slave-timing-reference-calibration-signal, wherein the slave-clock-signal is a clock signal for the slave-node.

In one or more embodiments:
the master-timing-reference-calibration-signal is representative of a master-timing-parameter for the master-reference-timing-circuit; and/or
the slave-timing-reference-calibration-signal is representative of a slave-timing-parameter for the slave-reference-timing-circuit.

In one or more embodiments, the master-reference-timing-circuit comprises a master-crystal-oscillator and/or the slave-timing-reference-circuit comprises a slave-crystal-oscillator.

In one or more embodiments, the master-transmitter comprises a master-UWB-transmitter, the master-communications-signal comprises an ultra wide band communications signal, and the slave-receiver comprises a slave-UWB-receiver.

In one or more embodiments, the communications system further comprises:
a master-calibrator-processor configured to determine a master-clock-reliability-indicator that is representative of the quality of the master-clock-signal; and optionally
wherein the master-timing-reference-calibrator is configured to determine the master-timing-reference-calibration-signal based on the master-clock-reliability-indicator.

In one or more embodiments, the communications system further comprises:
a GNSS-quality-monitor configured to determine a GNSS-timing-indicator that is representative of the quality of the GNSS based time reference signal; and optionally
wherein the master-timing-reference-calibrator is configured to determine the master-timing-reference-calibration-signal based on the GNSS-timing-indicator.

In one or more embodiments:
the master-timing-reference-calibrator is configured to determine the master-timing-reference-calibration-signal based on a communications-quality-indicator; and/or
the slave-timing-reference-calibrator is configured to determine the slave-timing-reference-calibration-signal based on the communications-quality-indicator; and optionally
the communications link between the master-node and the slave-node.

In one or more embodiments, the communications system further comprises:
a slave-calibrator-processor configured to determine a slave-clock-reliability-indicator that is representative of the quality of the slave-clock-signal; and optionally
wherein the slave-timing-reference calibrator is configured to determine the slave-timing-reference-calibration-signal based on the slave-clock-reliability-indicator.

In one or more embodiments, the communications system further comprises:
a master-calibrator-processor configured to determine a master-clock-reliability-indicator that is representative of the quality of the master-clock-signal; and wherein
the master-transmitter is configured to provide the master-clock-reliability-indicator to the slave-node;
the slave-receiver is configured to receive the master-clock-reliability-indicator from the master-node; and
the slave-timing-reference-calibrator is configured to determine the slave-timing-reference-calibration-signal based on the master-clock-reliability-indicator.

In one or more embodiments, the master-timing-reference-calibrator is configured to:
periodically determine the master-timing-reference-calibration-signal; and/or
determine the master-timing-reference-calibration-signal in response to a master-calibration-trigger-signal.

In one or more embodiments, the communications system further comprises a master-calibrator-processor configured to set the master-calibration-trigger-signal based on one or more of:
a master-temperature-value associated with the master-node; and
a master-clock-reliability-indicator that is representative of the quality of the master-clock-signal.

In one or more embodiments, the slave-timing-reference-calibrator is configured to determine the slave-timing-reference-calibration-signal in response to a slave-calibration-trigger-signal.

In one or more embodiments, the communications system further comprises a slave-calibrator-processor configured to set the slave-calibration-trigger-signal based on one or more of:
a slave-temperature-value associated with the slave-node;
a communication-quality-indicator that is representative of the communications link between the master-node and the slave-node; and
a slave-clock-reliability-indicator that is representative of the quality of the slave-clock-signal.

In one or more embodiments, the communications system further comprises:

a slave-calibrator-processor configured to determine a slave-timing-indicator that is representative of the quality of the slave-clock-signal; and a master-calibrator-processor configured to determine a master-timing-indicator that is representative of the quality of the master-clock-signal; and wherein the slave-timing-reference-calibrator is configured to determine the slave-timing-reference-calibration-signal based on the master-timing-indicator and the slave-timing-indicator.

In one or more embodiments, the GNSS receiver is hard-wired to the master-timing-reference-calibrator.

There may be provided a method comprising:

a master-node:
determining a master-timing-reference-calibration-signal, for calibrating the master reference timing circuit, based on a GNSS based time reference signal;
providing a master-clock-signal based on the master-timing-reference-calibration-signal, wherein the master-clock-signal is a clock signal for the master-node; and
determining a master-communications-signal using the master-clock-signal; and a slave-node:
receiving the master-communications-signal from the master-node;
determining a slave-timing-reference-calibration signal based on the master-communications-signal; and
providing a slave-clock-signal based on the slave-timing-reference-calibration-signal, wherein the slave-clock-signal is a clock signal for the slave-node.

There may be provided a method of processing comprising:

a GNSS receiver of a master-node providing a GNSS based time reference signal;
determining a master-timing-reference-calibration-signal based on the GNSS based time reference signal;
providing a master-clock-signal based on the master-timing-reference-calibration-signal, wherein the master-clock signal is a clock signal for the master-node;
determining a master-communications-signal using the master-clock-signal;
a slave-receiver of a slave-node receiving the master-communications-signal;
determining a slave-timing-reference-calibration-signal based on the master-communications-signal; and
providing a slave-clock-signal based on the slave-timing-reference-calibration-signal, wherein the slave-clock-signal is a clock signal for the slave-node.

While the disclosure is amendable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 1 shows an example embodiment of a communications system that includes a master-node and a slave-node;

FIG. 2 shows another example embodiment of a communications system that includes a master-node and a slave-node;

FIG. 3a shows components of a master-node according to an example embodiment that is similar to the master-node of FIG. 1;

Figure 4A:
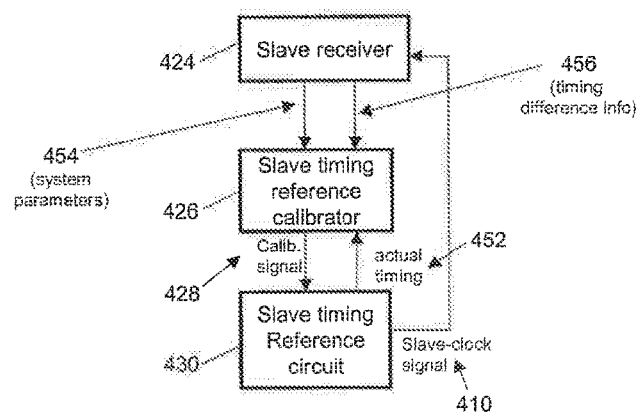
FIG. 4a shows components of a slave-node according to an example embodiment that is similar to the slave-node of FIG. 1.

Ultra Wide Band (UWB) pulse based communication and ranging systems can accurately determine distance and time difference between TX and RX due to time resolution that is inversely proportional to bandwidth, and can require an accurate timing reference at both receiver (RX) and transmitter (TX) to efficiently set up the communication. The accuracy of the timing reference can be based on a frequency reference such as one derived from a crystal (x-tal). Such crystals have production tolerances and can exhibit temperature and ageing effects. The ageing effects can be dominant in some cases. To help satisfy the accuracy requirements in UWB (~10's ppm), the crystal can be calibrated at production. Such calibration can also apply temperature compensation. This one-time calibration however does not cope with the ageing effects of the crystal over life time.

Hence systems can take into account a sufficient margin to cope with these inaccuracies, which can involve additional cost of the system both in terms of the integrated circuit (IC) hardware, and the quality of the crystal.

FIG. 1 illustrates an example embodiment of a communications system that includes a master-node 102 and a slave-node 104. As will be discussed in detail below, the master-node 102 can generate a master-clock-signal 108, which is calibrated using received GNSS based time reference signals 114. The GNSS based time reference signals 114 can provide accurate timing information that is extracted from GNSS signals, such as 1 pps (pulse per second). The master-node 102 can determine a master-communications-signal 106 using the master-clock-signal 108, and transmit that master-communications-signal 106 to the slave-node 104. The slave-node 104 can then calibrate a slave-clock-signal 110 for the slave-node 104 using the received master-communications-signal 106.

The system can therefore provide a calibration method for clock signals in a hybrid system, such as those provided by crystal oscillators in a UWB system. A hybrid system can be considered as one that includes nodes with direct access to GNSS, and nodes without direct access to GNSS. The calibration method can reduce the inaccuracy of the clock signals over the lifetime of the components because accurate calibration of both nodes can be performed using GNSS based time reference signals (either directly or indirectly).

The master-node 102 includes a global navigation satellite system (GNSS) receiver 112, such as a GPS receiver, which provides a GNSS based time reference signal 114.

The master-node 102 could be a vehicle or a smartphone, as non-limiting examples of devices that can have a GNSS receiver 112. The slave-node 104 could be a car key, a toke, a beacon, a sensor, a component that is configured to communicate using Bluetooth low energy, or an internet-of-things (IoT) node, as non-limiting examples of devices that may not have a GNSS receiver.

The master-node 102 also includes a master-timing-reference-calibrator 116 and a master-reference-timing-circuit 120. The master-timing-reference-calibrator 116 can determine a master-timing-reference-calibration-signal 118 for the master-reference-timing-circuit 120 based on the GNSS based time reference signal 114. The master-timing-reference-calibration-signal 118 can be representative of a master-timing-parameter for the master-reference-timing-circuit 120, and can also be referred to as a master-timing-reference-calibration-signal. The master-reference-timing-circuit 120 can provide the master-clock-signal 108 based on the master-timing-reference-calibration-signal 118. For instance, and as discussed in more detail below, the master-timing-reference-calibrator 116 can determine the accuracy of the master-clock-signal 108 by comparing it with timing information received as part of the GNSS based time reference signal 114, and then set a master-timing-parameter of the master-reference-timing-circuit 120 in order to improve the accuracy of the master-clock-signal 208, if required. For example, the master-timing-reference-calibration-signal 118 can be a digital value as result of a calibration cycle.

The master-clock-signal 108 is a clock signal for the master-node 102. In this example, the master-clock-signal 108 is a clock signal for a master-transmitter 122 of the master-node 102. The master-transmitter 122 can determine the master-communications-signal 106 using the master-clock-signal. The master-communications-signal 106 can be a communications signal according to any communications protocol. In one example the communications protocol is a UWB pulse based system, which can have particularly stringent requirements for timing accuracy.

The slave-node 104 includes a slave-receiver 124 that can receive the master-communications-signal 106 from the master-node 102. The slave-receiver 124 can receive the master-communications-signal 106 via wireless communication channel, which can be directly from the master-node 102, or indirectly via an intermediate node. The slave-node 104 also includes a slave-timing-reference-calibrator 126 can determine a slave-timing-reference-calibration-signal 128 based on the master-communications-signal 106. The slave-timing-reference-calibration-signal 128 can be representative of a slave-timing-parameter for the slave-reference-timing-circuit 130. The slave-reference-timing-circuit 130 can provide the slave-clock-signal 110 based on the slave-timing-reference-calibration-signal 128. The slave-timing-reference-calibrator 126 can determine the accuracy of the slave-clock-signal 110 by comparing it with timing information received as part of the master-communications-signal 106, and then set a slave-timing-parameter of the slave-reference-timing-circuit 130 in order to improve the accuracy of the slave-clock-signal 110, if required. In this way, the slave-clock-signal 110 is calibrated indirectly using information from the GNSS based time reference signal 114 of the master-node 102.

The slave-clock-signal 110 is a clock signal for the slave-node 104. In examples where the master-node 102 and the slave-node 104 are configured for two-way communication with each other, the master-node 102 can also include a master-receiver (not shown), and the slave-node 104 can include a slave-transmitter (not shown). The slave-clock-signal 110 can be used by the slave-transmitter to determine a slave-communications-signal to be transmitted to the master-receiver. In this way, communications modules (transmitters/receivers) associated with the master-node 102 and the slave-node 104 can be operated with clock signals that are well synchronised with each other, and therefore have good clock/frequency accuracy.

The master-reference-timing-circuit 120 and/or the slave-reference-timing-circuit 130 can be any circuit that can provide a suitable clock signal. For example, an RC network or any oscillator, including a crystal oscillator, can be used. Irrespective of the type of timing circuit that is used, a timing-parameter of the timing circuit can be set by the associated calibrator so as to calibrate/adjust the clock-signal that is provided as an output. Both the master-reference-timing-circuit 120 and the slave-reference-timing-circuit 130 can be calibrated based on the received GNSS based time reference signal 114 (either directly for the master-node 102, or indirectly for the slave-node 104).

FIG. 2 shows another example embodiment of a communications system that includes a master-node 202 and a slave-node 204.

In this example, a master-crystal-oscillator 220 provides the functionality of a master-reference-timing-circuit, and a slave-crystal-oscillator 230 provides the functionality of a slave-reference-timing-circuit.

The master-node 202 includes a GNSS receiver 212, which receives satellite signals, and provides a GNSS based time reference signal 214 to a master-UWB-transceiver 222. The master-UWB-transceiver 222 can provide the functionality of both a master-UWB-transmitter and a master-UWB-receiver, for communicating with the slave-node 204.

FIG. 2 shows a master-communications-signal 206 transmitted from the master-node 202 to the slave-node 204, and also a slave-communications-signal 236 transmitted from the slave-node 204 to the master-node 202.

The master-UWB-transceiver 222 includes a master-timing-reference-calibrator 216 (which can also be referred to as a master reference calibration engine) and a master-quality-monitor 232 (which can also be referred to as a reference quality monitor). The master-crystal-oscillator 220 provides a master-clock-signal to the master-UWB-transceiver 222.

In this example, the GNSS-receiver 212 is hard-wired to the master-timing-reference-calibrator 216. In this way, the master-UWB-transceiver 222 can have a hard-wired (direct) reference to the GNSS receiver 212. The GNSS receiver 212 can thus provide a hard-wired timing/frequency or time interval reference for the master-UWB-transceiver 222.

In some examples, the master-timing-reference-calibrator 216 can periodically determine the master-timing-reference-calibration-signal (based on the GNSS based time reference signal). In this way, the master-timing-reference-calibrator 216 can re-calibrate the master-crystal-oscillator 220 periodically. The optimal period can be a trade-off between: (i) stability of the master-crystal-oscillator 220, (ii) availability of a GNSS based time reference signal 214, and (iii) energy budget. In some examples, the period can be adaptively set, for example such that a longer period is applied when observed changes are within certain limits.

In some examples, the master-timing-reference-calibrator 216 can determine the master-timing-reference-calibration-signal in response to a master-calibration-trigger-signal. Various examples of how the master-calibration-trigger-signal can be set are described below with reference to FIGS. 3a and 3b.

The master-quality-monitor 232 can determine a master-timing-indicator that is representative of the quality/accuracy of the master-clock-signal provided by the master-crystal-oscillator 220. As will be discussed below, the master-timing-reference-calibrator 216 can determine the master-timing-indicator using a counting algorithm, or any other algorithm that is known in the art. The master-timing-reference-calibrator 216 can then determine a master-timing-reference-calibration-signal for the master-crystal-oscillator 220 based on the master-timing-indicator. For example, the master-timing-reference-calibrator 216 can adjust a master-timing-parameter until the master-timing-indicator satisfies a master-quality-criteria. The master-quality-criteria may be: a maximum value for the master-timing-indicator; or satisfaction of a predefined-threshold level. Further details of an example that uses a "reliability indicator" are provided below with reference to FIGS. 3a and 3b.

The master-node 202 can also include a GNSS-quality-monitor (not shown) that can determine a GNSS-timing-indicator that is representative of the availability/quality of the GNSS based time reference signal 214. The master-timing-reference-calibrator 216 can then determine a master-timing-reference-calibration-signal for the master-crystal-oscillator 220 based on the GNSS-timing-indicator. For example, the master-timing-reference-calibrator 216 can only adjust a master-timing-parameter if the GNSS-timing-indicator satisfies a GNSS-timing-criteria. The GNSS-timing-criteria may be: a minimum value for the GNSS-timing-indicator; or satisfaction of a predefined-threshold level.

The slave-node 204 includes a slave-UWB-transceiver 224. The slave-UWB-transceiver 224 can provide the functionality of both a slave-UWB-transmitter and a slave-UWB-receiver, for communicating with the master-node 202.

In this example, the slave-UWB-transceiver 224 includes a slave-timing-reference-calibrator 226 (which can also be referred to as a slave reference calibration engine) and a slave-quality-monitor 234 (which can also be referred to as a reference quality monitor). The slave-crystal-oscillator 230 provides a slave-clock-signal to the slave-UWB-transceiver 224.

The slave-quality-monitor 234 can determine a slave-timing-indicator that is representative of the quality of the slave-clock-signal provided by the slave-crystal-oscillator 230. The slave-timing-reference-calibrator 226 can then determine a slave-timing-reference-calibration-signal 210 for the slave-crystal-oscillator 230 based on the slave-timing-indicator. For example, the slave-timing-reference-calibrator 226 can adjust a slave-timing-parameter until the slave-timing-indicator satisfies a slave-quality-criteria. The slave-quality-criteria can be the same as, or different to, the master-quality-criteria.

In a similar way to the master-timing-reference-calibrator 216, the slave-timing-reference-calibrator 226 can determine the slave-timing-reference-calibration-signal based on the master-communications-signal: (i) periodically; and/or (ii) in response to a slave-calibration-trigger-signal. Various examples of how the slave-calibration-trigger-signal can be set are described below with reference to FIGS. 4a and 4b.

FIG. 3a shows components of a master-node according to an example embodiment that is similar to the master-node of FIG. 1. FIG. 3a shows a GNSS receiver 312, a master-timing-reference-calibrator 316 and a master-reference-timing-circuit 320. FIG. 3b shows the master-timing-reference-calibrator 316 in more detail.

The GNSS receiver 312 provides a GNSS based time reference signal, which is this example is referred to as a GNSS timing reference 314, to the master-timing-reference-calibrator 316. In this example, the master-timing-reference-calibrator 316 also receives a system-parameter-signal 338 that is representative of one or more system parameters, including master-node-parameters. As will be described below, the master-timing-reference-calibrator 316 can use the system-parameter-signal 338 to provide a master-timing-reference-calibration-signal 318 to the master-reference-timing-circuit 320, for calibrating the master-reference-timing-circuit 320.

The master-reference-timing-circuit 320 provides a master-clock-signal 308 (for example for a master-transmitter (not shown)) and also provides a master-timing-signal 342 to the master-timing-reference-calibrator 316. The master-timing-signal 342 may be the same as the master-clock signal 308, or may be any representation of the master-clock-signal 308 that is suitable for processing by the master-timing-reference-calibrator 316.

In this example, as shown in FIG. 3b, the master-timing-reference-calibrator 316 includes an error-measurement-block 250. The error-measurement-block 350 can process the GNSS timing reference 314 and the master-timing-signal 342 in order to determine a master-error-signal 349 that is representative of a difference between the two signals. The master-error-signal 349 can be representative of a master-timing-indicator, and in some examples can be calculated by using a counting algorithm that compares the master-clock-signal 308 with the (presumed accurate) GNSS timing reference 314.

The master-timing-reference-calibrator 316 also includes a master-calibrator-processor 349 in this example, which can process the system-parameter-signal 338 and/or the master-error-signal 349 in order to set a master-calibration-trigger-signal when it is determined that the master-reference-timing-circuit 320 should be calibrated. When the master-calibration-trigger-signal is set, the master-calibrator-processor 348 can provide a master-timing-reference-calibration-signal 318 to the master-reference-timing-circuit 320 for re-calibration. In this way, calibration can be provided on demand. This can be in addition to, or instead of, any periodic re-calibration that may be performed.

The master-calibration-trigger-signal can include calibration data that is expected to improve the accuracy of the master-reference-timing-circuit 320. In some examples, different sets of calibration data can be sent to the master-reference-timing-circuit 320 sequentially, in order to achieve a desired improvement in the accuracy of the master-reference-timing-circuit 320, or until the accuracy no longer significantly improves when new calibration data is sent. This can be determined by the master-calibrator-processor 348 monitoring the value of the master-error-signal 349.

The master-calibrator-processor 348 can set the master-calibration-trigger-signal in one or more of the following ways, as non-limiting examples:

the system-parameter-signal 338 may be representative of a master-temperature-value associated with the master-node. The master-temperature-value can represent the temperature of the environment around the master-node 202, the master-node 202 itself, or a component within the master-node 202 (such as the temperature of the master-reference-timing-circuit 320). In some examples, the master-temperature-value may represent a rate of change of temperature with respect to time, and/or a temperature-difference value. The temperature-difference value can be representative of a difference between a current temperature and the temperature when the master-reference-timing-circuit 320 was last calibrated.

The master-calibrator-processor 348 can set the master-calibration-trigger-signal based on the master-temperature-value. For example, when the master-temperaturevalue exceeds a temperature-threshold value. Using a temperature value to trigger calibration can be advantageous since temperature can affect the timing of the master-clock-signal 308 that is provided by the master-reference-timing-circuit 320.

the master-calibrator-processor 348 can determine a master-clock-reliability-indicator that is representative of an overall indication on how reliable the master-clock-signal is. The master-clock-reliability-indicator can be calculated based on a (optionally weighted) combination of parameters such as: (i) time since last calibration, (ii) temperature off-set since last calibration, (iii) previous calibration settings and conditions, (iv) variation of calibration, etc. As will be discussed below, in one implementation, the master-timing-reference-calibrator 316 can keep in memory a log of relevant parameters that can influence the accuracy of the master-clock-signal, and can apply a calibration control algorithm to the logged parameter values to calculate a value for the master-clock-reliability-indicator.

The master-calibrator-processor 348 can set the master-calibration-trigger-signal based on the master-clock-reliability-indicator. For example, when the master-clock-reliability-indicator exceeds a reliability-threshold value. Using a reliability indicator to trigger calibration can be advantageous since it can take into account one or more parameters that influence the timing of the master-clock-signal 308 that is provided by the master-reference-timing-circuit 320.

As discussed above, the master-timing-reference-calibrator 316 can assess when/if calibration is needed, or is likely to be beneficial. In this example, the master-timing-reference-calibrator 316 can also process and store relevant system parameters in memory, such as the data log 346 shown in FIG. 3b. For example, the master-timing-reference-calibrator 316 can store one or more system parameter values that are received as part of the system-parameter-signal 338 and/or a master-timing-indicator that is represented by the master-error-signal 349. The master-timing-reference-calibrator 316 can store such information periodically and/or at instants in time that the master-reference-timing-circuit 320 is re-calibrated.

In some examples, the master-timing-reference-calibrator 316 can determine the master-clock-reliability-indicator based on information, including historic information, stored in the data log 346. The master-timing-reference-calibrator 316 can also optionally store the master-clock-reliability-indicator in reliability-indicator-memory 344. The master-calibrator-processor 348 can set the master-calibration-trigger-signal based on variations of the information stored in the data log 346 and/or the reliability-indicator-memory 344. For instance, if a value is determined to have changed by more than a predetermined amount since the last re-calibration and/or if the rate of change of a value exceeds a threshold-value.

Figure 4B:
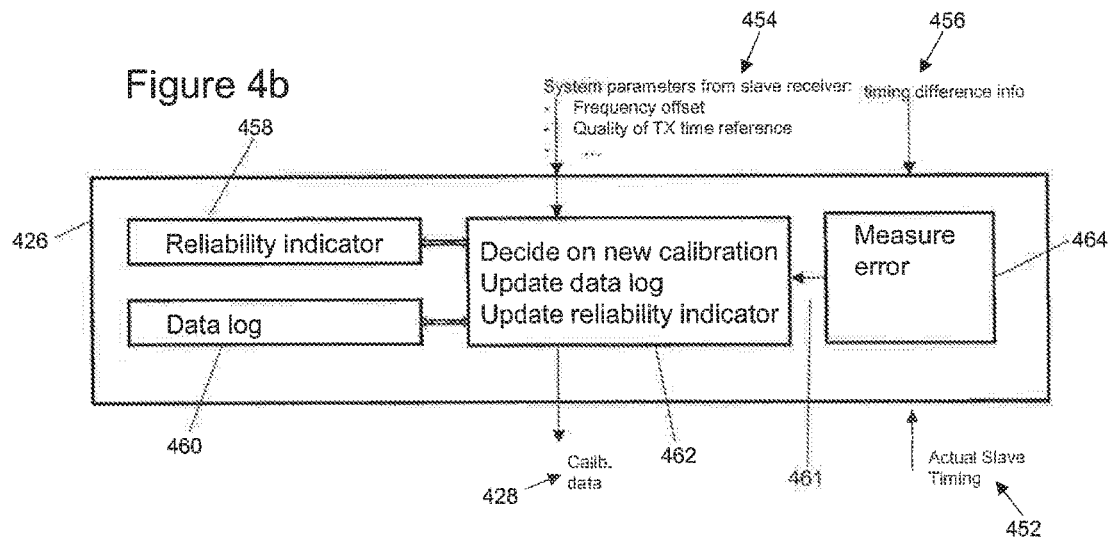
FIG. 4b shows the slave-timing-reference-calibrator of FIG. 4a in more detail.

Optionally, the master-calibrator-processor 348 may only send new calibration data to the master-reference-timing-circuit 320 in response to a master-calibration-trigger-signal if a GNSS-timing-indicator, which can be representative of the availability/quality of the GNSS based time reference signal, satisfies a predetermined GNSS-threshold value FIG. 4a shows components of a slave-node according to an example embodiment that is similar to the slave-node of FIG. 1. FIG. 4a shows a slave-receiver 424, a slave-timing-reference-calibrator 426 and a slave-reference-timing-circuit 430. FIG. 4b shows the slave-timing-reference-calibrator 426 in more detail.

The slave-receiver 424 receives a master-communications-signal (not shown) and provides a slave-timing-difference-signal 456 to the slave-timing-reference-calibrator 426. The slave-timing-reference-calibrator 426 also receives a system-parameter-signal 454 that is representative of one or more system parameters, including slave-node-parameters. Parts of the system-parameter-signal 454 can be received from the slave-receiver 424 and/or other components associated with the slave-node. As will be described below, the slave-timing-reference-calibrator 426 can use the system-parameter-signal 454 to provide a slave-timing-reference-calibration-signal 428 to the slave-reference-timing-circuit 430, for calibrating the slave-reference-timing-circuit 430.

The slave-reference-timing-circuit 430 provides a slave-clock-signal 410. In this example for the slave-receiver 424, and also provides a slave-timing-signal 452 to the slave-timing-reference-calibrator 426. The slave-timing-signal 452 may be the same as the slave-clock-signal 410, or may be any representation of the slave-clock-signal 410 that is suitable for processing by the slave-timing-reference-calibrator 426.

In this example, as shown in FIG. 4b, the slave-timing-reference-calibrator 426 includes an error-measurement-block 464. The error-measurement-block 464 can process the slave-timing-difference-signal 456 and optionally the slave-timing-signal 452 in order to determine a slave-error-signal 461 that is representative of a difference between the slave-clock-signal 410 and the master-clock-signal that has been received as part of the master-communications-signal. The slave-error-signal 461 can be representative of a slave-timing-indicator.

In some examples, the slave-timing-difference-signal 456 and/or the slave-error-signal 461 can be representative of an offset between the local slave-clock signal 410 and an incoming received UWB master-communications-signal. For instance, the slave-receiver 424 can provide information that is representative of a timing difference between the slave-receiver 424 and the master-transmitter, such as: a carrier frequency error signal, which can be a measure for carrier offset of TX frequency to RX frequency as detected in the (UWB) slave-receiver 424; and an accurate time interval within the master-communications-signal (based on TX timing accuracy).

In some examples, a master-UWB-transceiver (not shown) can transmit the master-timing-indicator to the slave-node. The transmission can be based on any protocol, and in this example is a UWB protocol. The slave-receiver 424 can therefore receive the master-timing-indicator from the master-node, and provide it to the slave-timing-reference-calibrator 426 as part of the system-parameter-signal 454. As will be discussed below, the slave-timing-reference-calibrator 426 can determine the slave-timing-reference-calibration-signal 428 based on the master-timing-indicator. For example, the slave-timing-reference-calibrator 426 can use the master-timing-indicator in combination with the offset described above to set the slave-timing-reference-calibration-signal 428, and optionally can store this information in memory.

The slave-timing-reference-calibrator 426 also includes a slave-calibrator-processor 462 in this example, which can process the system-parameter-signal 454 and/or the slave-error-signal 461 in order to set a slave-calibration-trigger-signal when it is determined that the slave-reference-timing-circuit 430 should be calibrated. When the slave-calibration-trigger-signal is set, the slave-calibrator-processor 462 can provide a slave-timing-reference-calibration-signal 428 to the slave-reference-timing-circuit 430 for re-calibration. This can be in addition to, or instead of, any periodic re-calibration that may be performed. In the same way as the master-calibration-trigger-signal described above, the slave-calibration-trigger-signal 428 can include calibration data that is expected to improve the accuracy of the salve-reference-timing-circuit 430.

The slave-calibrator-processor 462 can set the slave-calibration-trigger-signal 428 in one or more of the following ways, as non-limiting examples:

- if the slave-timing-difference-signal 456 and/or the slave-error-signal 461 are below a minimum-error-threshold, then the slave-calibrator-processor 462 can set the slave-calibration-trigger-signal such that re-calibration is performed.
- the system-parameter-signal 454 may be representative of a slave-temperature-value associated with the slave-node. The slave-temperature-value can represent any temperature associated with the slave-node, that corresponds to the examples described above with reference to the master-node. The slave-calibrator-processor 462 can set the slave-calibration-trigger-signal based on the slave-temperature-value.
- the system-parameter-signal 454 may be representative of a communications-quality-indicator, which is representative of the quality of the communications link between the master-node and the slave-node. The communications-quality-indicator can be determined from one or both of a master-communications-signal and a slave-communications-signal. For instance, if the communications-quality-indicator drops below a threshold-value then the slave-timing-reference-calibrator 426 can set the slave-calibration-trigger-signal for recalibrating the slave-reference-timing-circuit 430.
- the slave-calibrator-processor 462 can determine a slave-clock-reliability-indicator that is representative of an overall indication on how reliable the slave-clock-signal is, in a similar way to the master-clock-reliability-indicator that is described above. As will be discussed below, in one implementation, the slave-timing-reference-calibrator 426 can keep in memory a log of relevant parameters that can influence the accuracy of the slave-clock-signal, and can apply a calibration control algorithm to the logged parameter values to calculate a value for the slave-clock-reliability-indicator.
- The slave-calibrator-processor 462 can se the slave-calibration-trigger-signal based on the slave-clock-reliability-indicator.

In this example, the slave-timing-reference-calibrator 426 can also process and store relevant system parameters in memory, such as the data log 460 shown in FIG. 4b. For example, the slave-timing-reference-calibrator 426 can store one or more system parameter values that are received as part of the system-parameter-signal 454 and/or a slave-timing-indicator that is represented by the slave-error-signal 461 or the slave-timing-difference-signal 456. The slave-timing-reference-calibrator 426 can determine the slave-clock-reliability-indicator based on information, including historic information, stored in the data log 460. The slave-timing-reference-calibrator 426 can also optionally store the slave-clock-reliability-indicator in reliability-indicator-memory 458. The slave-timing-reference-calibrator 426 can store any of the information described herein periodically and/or at instants in time that the slave-reference-timing-circuit 430 is re-calibrated. In some examples, the slave-node can pass on the slave-clock-reliability-indicator to any downstream nodes that can use the slave-clock-signal 410 to calibrate a local timing circuit.

The slave-calibrator-processor 462 can optionally set the slave-calibration-trigger-signal based on variations of the information stored in the data log 460 and/or the reliability-indicator-memory 458. For instance, if a value is determined to have changed by more than a predetermined amount since the last re-calibration and/or if the rate of change of a value exceeds a threshold-value.

Optionally, the slave-calibrator-processor 462 may only send new calibration data to the slave-reference-timing-circuit 430 in response to a slave-calibration-trigger-signal if the master-timing-indicator and/or the slave-timing-indicator satisfies a slave-update-criteria. For example, by comparing the master-timing-indicator with the slave-timing-indicator, and only determining/adjusting the slave-timing-reference-calibration-signal 428 if the result of the comparison satisfies a comparison-threshold. For instance, only if the master-timing-indicator is greater than the slave-timing-indicator, or only if the master-timing-indicator is at least a predetermined amount greater that the slave-timing-indicator. In this way, the slave-reference-timing-circuit 430 is only re-calibrated if the calibration is expected to improve the quality of the slave-clock-signal 410. In this way, the slave-timing-reference-calibrator 426 can determine the slave-timing-reference-calibration-signal 428 based on both the master-timing-indicator and the slave-timing-indicator. The master-timing-indicator value can be transmitted in the UWB protocol as part of the master-communications-signal, and can be used to trigger calibration of the slave-node via a UWB link.

In this way, re-calibration can be performed based on one or both of: frequency offset estimation (single of multiple transmissions to iterative converge); and time delta between transmissions controlled by accurate master timing, as non-limiting examples.

In some examples, the master- or slave-timing-reference-calibrator can calibrate the master- or slave-timing-reference-circuit from scratch. That is, the clock-signal does not necessarily need to have a timing that is sufficiently close to a desired timing, in order for the slave-timing-reference-calibrator to be able to improve the accuracy of the clock-signal. In this way, the system can have a sufficiently large margin to accommodate a large offset in the timing of the clock-signal. The slave-timing-reference-calibrator can thus be used for production calibration (such that it requires no prior information, for example for first time start calibration, or following a loss of data for re-initialisation), or in a forced calibration mode or a recovery calibration mode (for example where only small deviations/errors in the timing information are expected).

The master-timing-reference-calibrator 216 and/or slave-timing-reference-calibrator 226 can be considered as an intelligent control system that executes calibration sequences. It can provide a recovery mode in case of failure (such as loss of calibration memory), and it can provide a mode for initial calibration that can be used for initial calibration (such as for factory or device initialisation).

Returning now to FIG. 2, one example of a calibration event that can be performed by one or both of the UWB-transceivers 222, 224 is as follows.

A re-cal trigger flag can be stored in memory that is accessible by the UWB-transceiver 222, 224. The re-cal trigger flag can be set by a calibration-trigger-signal based on expiry of an elapsed time, determination of an environmental difference (such as temperature), or an observed frequency delta in UWB link (that is a difference between the timings of the master- and slave-clock signals 208, 210, as non-limiting examples, and as discussed above.

In the re-cal trigger flag is set, then: (i) the GNSS-quality-monitor can determine a GNSS-timing-indicator that is representative of the availability of the GNSS based time reference signal 214; and (ii) a communications-quality-monitor (which could be proved by the slave-quality-monitor 234 and/or the master-quality-monitor 232) can determine a communications-quality-indicator that is representative of the quality of the communications link between the master-node 202 and the slave-node 204. A controller (not shown) can then compare the GNSS-timing-indicator and the communications-quality-indicator with associated criteria/thresholds. If the GNSS-timing-indicator and the communications-quality-indicator do not satisfy the associated criteria-thresholds, then the sequence is stopped without calibrating the master-crystal-oscillator 220 and the slave-crystal-oscillator 230.

If the GNSS-timing-indicator and the communications-quality-indicator do satisfy the associated criteria/thresholds, then the sequence continues by the master-timing-reference-calibrator 216 and/or the slave-timing-reference-calibrator 226 executing a counting cycle based on a latest calibration value that is available, and calculating a different timing-parameter value for the associated crystal-oscillator 220, 230. For instance, a number of cycles in the clock-signal in a predefined period can be counted (for the master-node 202; GNSS can use 1 pps; for the slave-node 204: a fixed accurate repetition period can be defined for a protocol (such as UWB) that is used by the slave-node 202). For a 27 MHz reference crystal oscillator, that is 27 M counts in case of no error and the count difference is used to calibrate the associated crystal-oscillator 220, 230. In this way, the delta in the count is compared to the expected count and then is used to calibrate. Such processing is known in the art, for example as described in Appendix A of "NIST Frequency Measurement and Analysis System: Operator's Manual" by Michael A. Lombardi. In this way, the master-timing-reference-calibrator 216 and/or the slave-timing-reference-calibrator 226 can determine a calibration-signal based on the communications-quality-indicator.

In some examples, the controller can re-do the counting cycle for the clock-signal when the new timing-parameter value is applied, and verify that the timing accuracy of the clock-signal associated with the new timing-parameter value is within a target accuracy. If the timing accuracy is within the target accuracy, then calibration is finalised, the master-timing-reference-calibrator 216 and/or the slave-timing-reference-calibrator 226 stores the new timing-parameter value and optionally other relevant data (such as a time stamp, temperature, etc), and sets/maintains the calibration-signal for the associated crystal-oscillator 220, 230 based on the new timing-parameter value. The master-timing-reference-calibrator 216 and/or the slave-timing-reference-calibrator 226 can also reset the re-cal trigger flag.

If the timing accuracy associated with the new timing-parameter value is not within the target accuracy, then the master-timing-reference-calibrator 216 and/or the slave-timing-reference-calibrator 226 can apply a different timing-parameter value, and then determine whether or not the timing accuracy associated with that timing-parameter value is within the target accuracy. In some examples, the master-timing-reference-calibrator 216 and/or the slave-timing-reference-calibrator 226 can limit the number of times that different timing-parameter values are tried to a predetermined number. If the timing accuracy fails to converge satisfactorily (by not satisfying an accuracy-threshold or other accuracy-criteria), then the calibration sequence is stopped without calibrating the master-crystal-oscillator 220 and the slave-crystal-oscillator 230. That is, the timing-parameter can be returned to the values that they had before the calibration sequence began. In one example implementation, a controller can monitor the accuracy by executing a plurality of calibration cycles, and monitoring the relative spread as an indicator for the accuracy/reliability of the calibration action.

It will be appreciated that the generation of the master-timing-reference-calibration-signal and/or the slave-timing-reference-calibration-signal may be based on sequential processing (such as generating a trigger signal and then checking some other parameter) or combined processing (such as by using an algorithm that processes multiple/all parameters together).

Examples disclosed herein can be used in, or with, any device that has a UWB transceiver. For instance, for car access and smart access solutions (distance bounding feature) that can include a: car, car key, smartphone, IoT devices, etc.

One or more of the examples disclosed herein relate to a system for reference calibration in UWB ranging/communication systems, based on a combination of GNSS enabled nodes as well as nodes without GNSS. A reference quality can be monitored and calibrated according to needs either based on the available GNSS reference, or based on the UWB signal from a higher quality node.

As discussed above, systems disclosed herein can also communicate status information between nodes, and can include appropriate schemes for initiating calibration actions. Also, systems can include functionality to enable them to recover from a totally uncalibrated situation (that could also be used for initial calibration of the system).

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one ore more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A communications system comprising:
a master-node comprising:
a GNSS receiver configured to provide a GNSS based time reference signal;
a GNSS-quality-monitor configured to determine a GNSS-timing-indicator that is representative of the quality of the GNSS based time reference signal, wherein a master-timing-reference-calibrator is configured to determine a master-timing-reference-calibration-signal based on the GNSS-timing-indicator; the master-timing-reference-calibrator configured to determine the master-timing-reference-calibration-signal, for calibrating the master reference timing circuit, based on the GNSS based time reference signal
a master-reference-timing-circuit configured to provide a master-clock-signal based on the master-timing-reference-calibration-signal, wherein the master-clock-signal is a clock signal for the master-node; and
a master-transmitter configured to determine a master-communications-signal using the master-clock-signal;
a slave-node comprising:
a slave-receiver configured to receive the master-communications-signal from the master-node;
a slave-timing-reference-calibrator configured to determine a slave-timing-reference-calibration-signal based on the master-communications-signal; and
a slave-timing-reference-circuit configured to provide a slave-clock-signal based on the slave-timing-reference-calibration-signal, wherein the slave-clock-signal is a clock signal for the slave-node.

2. The communications system of claim 1, wherein:
the master-timing-reference-calibration-signal is representative of a master-timing-parameter for the master-reference-timing-circuit; and
the slave-timing-reference-calibration-signal is representative of a slave-timing-parameter for the slave-reference-timing-circuit.

3. The communications system of claim 1, wherein the master-reference-timing-circuit comprises a master-crystal-oscillator and/or the slave-timing-reference-circuit comprises a slave-crystal-oscillator.

4. The communications system of claim 1, wherein the master-transmitter comprises a master-MB-transmitter, the master-communications-signal comprises an ultra wide band communications signal, and the slave-receiver comprises a slave-UWB-receiver.

5. The communications system of claim 1, further comprising:
a master-calibrator-processor configured to determine a master-clock-reliability-indicator that is representative of the quality of the master-clock-signal; and
wherein the master-timing-reference-calibrator is configured to determine the master-timing-reference-calibration-signal based on the master-clock-reliability-indicator.

6. The communications system of claim 1, wherein:
the master-timing-reference-calibrator is configured to determine the master-timing-reference-calibration-signal based on a communications-quality-indicator;
the slave-timing-reference-calibrator is configured to determine the slave-timing-reference-calibration-signal based on the communications-quality-indicator; and
the communications-quality-indicator is representative of the quality of the communications link between the master-node and the slave-node.

7. The communications system of claim 1, further comprising:
a slave-calibrator-processor configured to determine a slave-clock-reliability-indicator that is representative of the quality of the slave-clock-signal; and
wherein the slave-timing-reference-calibrator is configured to determine the slave-timing-reference-calibration-signal based on the slave-clock-reliability-indicator.

8. The communications system of claim 1, further comprising:
a master-calibrator-processor configured to determine a master-clock-reliability-indicator that is representative of the quality of the master-clock-signal; and wherein
the master-transmitter is configured to provide the master-clock-reliability-indicator to the slave-node;
the slave-receiver is configured to receive the master-clock-reliability-indicator from the master-node; and
the slave-timing-reference-calibrator is configured to determine the slave-timing-reference-calibration-signal based on the master-clock-reliability-indicator.

9. The communications system of claim 1, wherein the master-timing-reference-calibrator is configured to:
periodically determine the master-timing-reference-calibration-signal; or
determine the master-timing-reference-calibration-signal in response to a master-calibration-trigger-signal.

10. The communications system of claim 9, further comprising a master-calibrator-processor configured to set the master-calibration-trigger-signal based on one or more of:
a master-temperature-value associated with the master-node; and a master-clock-reliability-indicator that is representative of the quality of the master-clock-signal.

11. The communications system of claim 1, wherein the slave-timing-reference-calibrator is configured to determine the slave-timing-reference-calibration-signal in response to a slave-calibration-trigger-signal.

12. The communications system of claim 11, further comprising a slave-calibrator-processor configured to set the slave-calibration-trigger-signal based on one or more of:
   a slave-temperature-value associated with the slave-node;
   a communication-quality-indicator that is representative of the communications link between the master-node and the slave-node; and
   a slave-clock-reliability-indicator that is representative of the quality of the slave-clock-signal.

13. The communications system of claim 1, further comprising:
   a slave-calibrator-processor configured to determine a slave-timing-indicator that is representative of the quality of the slave-clock-signal; and
   a master-calibrator-processor configured to determine a master-timing-indicator that is representative of the quality of the master-clock-signal; and wherein
   the slave-timing-reference-calibrator is configured to determine the slave-timing-reference-calibration-signal based on the master-timing-indicator and the slave-timing-indicator.

14. The communications system of claim 1, wherein the GNSS receiver is hard-wired to the master-timing-reference-calibrator.

15. A communications system comprising:
   a master-node comprising:
      a GNSS receiver configured to provide a GNSS based time reference signal;
      a master-calibrator-processor configured to determine a master-clock-reliability-indicator that is representative of the quality of the master-clock-signal, wherein a master-timing-reference-calibrator is configured to determine a master-timing-reference-calibration-signal based on the master-clock-reliability-indicator; the master-timing-reference-calibrator configured to determine the master-timing-reference-calibration-signal, for calibrating the master reference timing circuit, based on the GNSS based time reference signal; and
      a master-reference-timing-circuit configured to provide a master-clock-signal based on the master-timing-reference-calibration-signal, wherein the master-clock-signal is a clock signal for the master-node; and
      a master-transmitter configured to determine a master-communications-signal using the master-clock-signal;
   a slave-node comprising:
      a slave-receiver configured to receive the master-communications-signal from the master-node;
      a slave-timing-reference-calibrator configured to determine a slave-timing-reference-calibration-signal based on the master-communications-signal; and
      a slave-timing-reference-circuit configured to provide a slave-clock-signal based on the slave-timing-reference-calibration-signal, wherein the slave-clock-signal is a clock signal for the slave-node.

* * * * *